US012702006B2

(12) United States Patent
Tsou et al.

(10) Patent No.: US 12,702,006 B2
(45) Date of Patent: Aug. 4, 2026

(54) METHOD FOR SINGULATING SEMICONDUCTOR DEVICES AND MANUFACTURING A PACKAGE DEVICE INCLUDING THE SEMICONDUCTOR DEVICES

(71) Applicant: Taiwan Semiconductor Manufacturing Co., Ltd., Hsinchu (TW)

(72) Inventors: Hsien-Ju Tsou, Taipei (TW); Yung-Chi Lin, Su-Lin City (TW); Yi-Hsiu Chen, Hsinchu (TW); Tsang-Jiuh Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 598 days.

(21) Appl. No.: 18/152,626

(22) Filed: Jan. 10, 2023

(65) Prior Publication Data

US 2024/0222292 A1     Jul. 4, 2024

Related U.S. Application Data

(60) Provisional application No. 63/436,335, filed on Dec. 30, 2022.

(51) Int. Cl.
| | |
|---|---|
| *H10P 52/00* | (2026.01) |
| *H10P 50/24* | (2026.01) |
| *H10W 42/00* | (2026.01) |

(52) U.S. Cl.
CPC ......... *H10W 42/121* (2026.01); *H10P 50/242* (2026.01); *H10P 52/00* (2026.01)

(58) Field of Classification Search
CPC ........ H10P 50/242; H10P 52/00; H10P 54/00; H10W 42/121
See application file for complete search history.

(56) References Cited

U.S. PATENT DOCUMENTS

| | | | |
|---|---|---|---|
| 11,574,861 | B2 | 2/2023 | Wang et al. |
| 2012/0286397 | A1 | 11/2012 | Kuechenmeister et al. |
| 2022/0406752 | A1* | 12/2022 | Wang ...................... H10P 54/00 |

(Continued)

FOREIGN PATENT DOCUMENTS

| | | |
|---|---|---|
| TW | 201250948 A | 12/2012 |
| TW | 202238753 A | 10/2022 |

*Primary Examiner* — Telly D Green
(74) *Attorney, Agent, or Firm* — Slater Matsil, LLP

(57) ABSTRACT

In an embodiment, a device includes an integrated circuit die including a first sidewall, a second sidewall, and a third sidewall, wherein the third sidewall of the integrated circuit die is connected to the first sidewall of the integrated circuit die and the second sidewall of the integrated circuit die, wherein the third sidewall of the integrated circuit die forms a chamfered corner of the integrated circuit die; a first dielectric surrounding the integrated circuit die; a semiconductor feature disposed over the integrated circuit die, wherein the semiconductor feature includes a first sidewall, a second sidewall, and a third sidewall, wherein the third sidewall of the semiconductor feature is connected to the first sidewall of the semiconductor feature and the second sidewall of the semiconductor feature and forms a chamfered corner of the semiconductor feature; and a second dielectric surrounding the semiconductor feature.

20 Claims, 25 Drawing Sheets

(56) References Cited

U.S. PATENT DOCUMENTS

| | | | | |
|---|---|---|---|---|
| 2023/0187301 A1* | 6/2023 | Wietstruck | ............ | H10W 40/22 |
| | | | | 257/668 |
| 2023/0282525 A1* | 9/2023 | Wu | ......................... | H10D 84/08 |
| | | | | 257/76 |
| 2023/0335534 A1* | 10/2023 | Yeh | ......................... | H10P 72/74 |
| 2024/0112924 A1* | 4/2024 | Chen | ................... | H10W 70/614 |

* cited by examiner

200

C

150

150

220

222

222

α

300

D

220

222

150

152

152

β

222

300

METHOD FOR SINGULATING SEMICONDUCTOR DEVICES AND MANUFACTURING A PACKAGE DEVICE INCLUDING THE SEMICONDUCTOR DEVICES

PRIORITY CLAIM AND CROSS-REFERENCE

This application claims the benefit of U.S. Provisional Application No. 63/436,335, filed on Dec. 30, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 is a cross-sectional view of a semiconductor piece, in accordance with some embodiments.
Figure 1:

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a semiconductor piece is singulated to become integrated circuit dies and inactive features, with providing chamfered corners on the individual integrated circuit dies and on the inactive features. As such, corners of the integrated circuit dies and corners of the inactive features may have an enlarged space therebetween, and collisions between adjacent corners of adjacent ones of the integrated circuit dies and the inactive features may be reduced or prevented during transportation, thereby reducing damages of the integrated circuit dies.

FIG. 1 illustrates a cross-sectional view of a semiconductor piece 30 in accordance with some embodiments. The semiconductor piece 30 may be a semiconductor wafer. The semiconductor piece 30 may include integrated circuit regions 30D and scribe regions 30S, and these integrated circuit regions 30D may be separated by the scribe regions 30S. In the subsequent processes, these integrated circuit regions 30D may be singulated to be integrated circuit dies 150 and will be packaged to form integrated circuit package. In some embodiments, the integrated circuit regions 30D may include circuits of a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, wide input/output (WIO) memory, NAND flash, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. As such, the integrated circuit dies 150 may be the logic die, the memory die, the power management die, the radio frequency (RF) die, the sensor die, the MEMS die, the signal processing die (e.g., digital signal processing (DSP) die), the front-end die (e.g., analog front-end (AFE) dies), the like, or combinations thereof.

The semiconductor piece 30 may be processed according to applicable manufacturing processes to form the integrated circuits in the integrated circuit regions 30D. For example, each of the integrated circuit regions 30D includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) may be formed at the front surface of the semiconductor substrate 52. The devices 54 may be active devices (e.g., transistors, diodes, etc.), capacitors, resistors, etc. For example, the devices 54 may be transistors that include gate structures and source/drain regions, where the gate structures are on channel regions, and the source/drain regions are adjacent the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Contacts 58 extend through the ILD 56 to electrically and physically couple the devices 54. For example, when the devices 54 are transistors, the contacts 58 may couple the gates and source/drain regions of the transistors. The contacts 58 may be formed of tungsten, cobalt, nickel, copper, silver, gold, aluminum, the like, or combinations thereof. An interconnect structure 60 is over the ILD 56 and contacts 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers, which may be formed in the low-k dielectric layers by a damascene process, such as a single damascene process, a dual damascene process, or the like. The metallization patterns may be formed of a suitable conductive material, such as copper, tungsten, aluminum, silver, gold, a combination thereof, or the like. The metallization patterns of the interconnect structure 60 are electrically coupled to the devices 54 by the contacts 58. In some embodiments, passive devices are also formed in the interconnect structure 60. Pads 62, such as aluminum pads, to which external connections are made. The pads 62 are on the active side of the integrated circuit dies 150, such as in and/or on the interconnect structure 60.

The conductive vias 66 extend into the interconnect structure 60 and/or the semiconductor substrate 52. The conductive vias 66 are electrically coupled to the pads 62 and the metallization patterns of the interconnect structure 60. The conductive vias 66 may be through-substrate vias, such as through-silicon vias. As an example to form the conductive vias 66, recesses can be formed in the interconnect structure 60 and/or the semiconductor substrate 52 by, for example, etching, milling, laser techniques, a combination thereof, or the like. A thin barrier layer may be conformally deposited in the recesses, such as by CVD, atomic layer deposition (ALD), physical vapor deposition (PVD), a combination thereof, or the like. The barrier layer may include titanium, titanium nitride, tantalum, tantalum nitride, combinations thereof, or the like. A conductive material may be deposited over the barrier layer and in the recesses. The conductive material may be formed by electroplating, electroless plating, CVD, ALD, PVD, a combination thereof, or the like. Examples of the conductive material include copper, silver, gold, tungsten, cobalt, aluminum, nickel, alloy thereof, a combination thereof, or the like. In some embodiments, the conductive material is copper. Excess conductive material and barrier layer are removed by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 and extend into the semiconductor substrate 52. The conductive vias 66 formed by the via-middle process are connected to a middle metallization pattern of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern of the interconnect structure 60. In yet another embodiment, the conductive vias 66 are formed by a via-last process, such that the conductive vias 66 extend through an entirety of the interconnect structure 60 and extend into the semiconductor substrate 52. The conductive vias 66 formed by the via-last process are connected to the upper metallization pattern of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), or boron-doped phosphosilicate glass (BPSG); a nitride such as silicon nitride or silicon oxynitride; combinations thereof; or the like. The dielectric layer 72 may be formed, for example, by CVD, spin coating, lamination, or the like. In some embodiments, the dielectric layer 72 is formed of silicon oxide.

Die connectors 74 extend through the dielectric layer 72 and the passivation layer(s) 68. The die connectors 74 may include conductive pillars, pads, or the like, to which external connections can be made. In some embodiments, the die connectors 74 include bond pads at the front-side surface of the integrated circuit die 150, and include post-pad vias that connect the bond pads to the interconnect structure 60. In such embodiments, the die connectors 74 (including the bond pads and the post-pad vias) may be formed by a damascene process, such as a single damascene process, a dual damascene process, or the like. The die connectors 74 can be formed of a conductive material, such as a metal, such as copper or its alloy, or the like, which can be formed by, for example, plating, or the like. In some embodiments, the dielectric layer 72 and the die connectors 74 are omitted or can be formed in the manufacturing process of forming an integrated circuit package.

In some embodiments, the scribe regions 30S may include scribe lines 80. The scribe regions 30S may be a blank region, or may include testing elements or other dummy elements (not shown). In some embodiments, a singulation process is performed on the semiconductor piece 30 to separate the integrated circuit dies 150 (see FIG. 4). FIGS. 2A, 2C, 3, 4, and 5 illustrate exemplary cross-sectional views at the intermediate stages of performing the singulation process on the semiconductor piece 30, in accordance with some embodiments. FIG. 2B illustrates an exemplary plan view of the semiconductor piece 30 at an intermediate stage of performing the singulation process on the semiconductor piece 30, in accordance with some embodiments. FIGS. 2A, 2C, 3, and 4 are cross-sectional views shown along respective reference cross-section A-A in the plan view as illustrated in FIG. 2B, and FIG. 2C is a cross-sectional view shown along respective reference cross-section B-B in the plan view as illustrated in FIG. 2B.

Figure 2A:
FIGS. 2A, 2C, 3, 4, and 5 are cross-sectional views at intermediate stages of performing a singulation process on a semiconductor piece, in accordance with some embodiments.
Figure 2B:
FIG. 2B is a plan view of a semiconductor piece at an intermediate stage of performing a singulation process on the semiconductor piece, in accordance with some embodiments.
Figure 2C:

Referring to FIG. 2A, a dicing process is performed on the front side of the semiconductor piece 30 to from trenches 102, in accordance with some embodiments. The trenches 102 may be partially through the semiconductor piece 30. For example, the trenches 102 may extend into the semiconductor substrate 52, such as having a depth smaller than the thickness of the semiconductor piece 30. The bottom of the trenches 102 may be lower than the bottom of the conductive vias 66. As illustrated in FIG. 2A, the trenches 102 may have vertical sidewalls, such as being perpendicular to a major surface of the semiconductor piece 30. In some embodiments, the trenches 102 have tilted sidewalls. For example, a width of the trenches 102 at a first depth may be greater than a width of the trenches 102 at a second depth that is deeper than the first depth.

In some embodiments, the dicing process is performed by a dry etching process, though other methods such as knife-cutting or laser engraving can also be implemented. In some embodiments in which the dry etching process is used, a mask (not shown) is formed over the semiconductor piece 30. The mask may be a photoresist, a hard mask, or a combination thereof. The mask may be patterned to have a pattern corresponding to the pattern of scribe lines 80 (or the trenches 102). For example, the mask may be patterned using suitable lithography techniques and/or etching processes. In some embodiments, the lithography techniques for patterning the mask include exposing the mask by an irradiation of extreme ultraviolet (EUV) light, ultraviolet light, excimer laser, e-beam, combinations thereof, or the like. In some embodiments in which knife-cutting or laser engraving is used for the dicing process, the mask may be omitted.

In some embodiments in which the dry etching process is used, the trenches 102 may be formed by etching the semiconductor piece 30 by a plasma dry etching, which may include a fluorine plasma, a chlorine plasma, a combination thereof, or the like. The plasma may be generated from a gas source. The gas source includes a suitable etchant in combination with a carrier gas. Acceptable fluorine-based etchants may include $CF_4$, $CHF_3$, $CH_2F_2$, octafluorocyclobutane ($C_4F_8$), sulfur hexafluoride ($SF_6$), a combination thereof, or the like. Acceptable chlorine-based etchants may include $Cl_2$, $CCl_4$, $CHCl_3$, $CH_2Cl_2$, a combination thereof, or the like. The carrier gas may be $N_2$ or an inert gas such as Ar, He, Xe, Ne, Kr, Rn, the like, or combinations thereof. The plasma may be generated by a plasma generator such as an inductively coupled plasma system, a capacitively coupled plasma system, a remote plasma generator, or the like. The plasma generator generates radio frequency power that excites the gas source to a plasma state. During or after the dicing process, the mask is removed, such as by an ashing, stripping, or etching process, or a combination thereof.

FIG. 2B shows a pattern of the trenches 102 on a portion of the semiconductor piece 30, in accordance with some embodiments. The dicing process is performed along the scribe lines 80 for forming the trenches 102. The scribe lines 80 may include first scribe lines, second scribe lines, and third scribe lines. The trenches 102 may include first trenches 104 that have a similar pattern to the first scribe lines, second trenches 106 that have a similar pattern to the second scribe lines, and third trenches 108 that have a similar pattern to the third scribe lines. The first trenches 104, the second trenches 106, and the third trenches 108 may have same or similar width as the width of the first scribe lines, the width of the second scribe lines, and the width of the third scribe lines, respectively, and therefore they are indistinguishable in the plan view, such as in FIG. 2B. It is also appreciated that the first trenches 104, the second trenches 106, and the third trenches 108 may have a width greater or smaller than the width of the first scribe lines, the width of the second scribe lines, and the width of the third scribe lines, respectively.

In some embodiments, the semiconductor piece 30 is partially separated by the trenches 102 to include integrated circuit regions 120, first inactive regions 122, second inactive regions 124, and third inactive regions 126. The integrated circuit regions 120 of the semiconductor piece 30 may be partially connected by the first inactive regions 122, the second inactive regions 124, and the third inactive regions 126. In some embodiments, the integrated circuit regions 120 of the semiconductor piece 30 will be completely separated to form integrated circuit dies 150 by a back-side thinning process (e.g., see FIG. 4).

The first trenches 104 (or the first scribe lines) may extend in a first direction (e.g., horizontal) in the plan view, and the second trenches 106 (or the second scribe lines) may extend in a second direction (e.g., vertical) in the plan view. The second trenches 106 may be perpendicular (within process variations) to the first trenches 104. The first trenches 104 may include first segments 104A and second segments 104B. The first segments 104A of the first trenches 104 and the second segments 104B of the first trenches 104 are separated from each other and also misaligned from each other in the second direction. The second trenches 106 may include first segments 106A and second segments 106B. The first segments 106A of the second trenches 106 and the second segments 106B of the second trenches 106 are separated from each other and also misaligned from each other in the first direction. In some embodiments, the first segments 104A of the first trenches 104 and the second segments 104B of the first trenches 104 are connected by the third trenches 108 (or the third scribe lines), and the first segments 106A of the second trenches 106 and the second segments 106B of the second trenches 106 are connected by the third trenches 108 (or the third scribe lines). The third trenches 108 also connect the first trenches 104 and the second trenches 106. As an example, one end of the third trenches 108 may intersect a respective one of the first segment 104A of the first trenches 104 and a respective one of the first segment 106A of the second trenches 106, thereby forming a first intersecting area 130. Another end of the one of the third trenches 108 may intersect a respective one of the second segments 104B of the first trenches 104 and a respective one of the second segments 106B of the second trenches 106, thereby forming a second intersecting area 132. In some embodiments, the first intersecting area 130 is greater than the second intersecting area 132.

The semiconductor piece 30 may be separated to include multiple regions by the first trenches 104, the second trenches 106, and the third trenches 108, such as including the integrated circuit regions 120, the first inactive regions 122, the second inactive regions 124, and the third inactive regions 126. Each of the integrated circuit regions 120 includes the integrated circuits within it. In some embodiments, the first to third inactive regions 122, 124, and 126 do not have integrated circuits or do not have active integrated circuits. The integrated circuit regions 120 may each include a first edge 120A in the first direction (e.g., horizontal), a second edge 120B in the second direction (e.g., vertical), and a third edge 120C connecting the first edge 120A and the second edge 120B of the integrated circuit regions 120. The third edge 120C of the integrated circuit region 120 may be a chamfered corner of the integrated circuit region 120 and may be provided by forming the third trenches 108. The third edge 120C of the integrated circuit region 120 may have a length $L_1$, which may be in a range from 30 μm to 150 μm and be shorter than the first edge 120A and the second edge 120B of the integrated circuit region 120. In some embodiments, the first edge 120A of the integrated circuit region 120 is longer than the second edge 120B of the integrated circuit region 120. In some embodiments, the integrated circuit regions 120 have a shape of octagon in a plan view. In some embodiments, the first edge 120A and the third edge 120C of the integrated circuit region 120 may have an included angle α ranging from 120 degrees to 150 degrees. Although FIG. 2B illustrates the third edge 120C is a straight line, the third edge 120C may be a curved line.

In some embodiments, a first inactive region 122 is disposed between adjacent ones of the integrated circuit regions 120 in the second direction. As an example, the first inactive region 122 may be between the first edges 120A of the adjacent ones of integrated circuit regions 120 and be separated from the integrated circuit regions 120 by the first segments 104A of the first trenches 104. Accordingly, the first inactive regions 122 may each have a first edge 122A along the first segment 104A of the first trenches 104 and a second edge 122B along the first segment 106A of the second trenches 106. In some embodiments, each of the first inactive regions 122 also has a third edge 122C connecting to the first edge 122A and the second edge 122B of the first inactive region 122. The third edge 122C of the first inactive region 122 may be a chamfered corner of the first inactive region 122. In some embodiments, the third edge 120C of the first inactive region 122 may have a length $L_2$, which may be in a range from 30 μm to 150 μm and be shorter than the first edge 120A of the integrated circuit region 120 and the second edge 120B of the integrated circuit region 120. In some embodiments, the length $L_2$ of the chamfered corner of the first inactive region 122 is equal to or greater than the length $L_1$ of the chamfered corner of the integrated circuit regions 120. In some embodiments, the first edge 122A and the third edge 122C of the first inactive region 122 may have an included angle β ranging from 120 degrees to 150 degrees. In some embodiments, the angle β may be greater than or equal to the angle α. In some embodiments, the first inactive regions 122 may have a shape of octagon in a plan view. Although FIG. 2B illustrates the third edge 122C is a straight line, the third edge 122C may be a curved line.

In some embodiments, a second inactive region 124 is disposed between adjacent ones of integrated circuit regions 120 in the first direction. As an example, the second inactive regions 124 may be between the second edges 120B of adjacent ones of the integrated circuit regions 120 and be separated from the integrated circuit regions 120 by the second segments 106B of the second trenches 106. In some embodiments, the second inactive regions 124 may have a first edge 124A along the second segment 104B of the first trenches 104 and a second edge 124B along the second segment 106B of the second trenches 106. The first edge 124A and the second edge 124B of the second inactive regions 124 may intersect and form a right-angle corner, or a corner that has an included angle of over 85 degrees. The second inactive regions 124 may be free of chamfered corners. In some embodiments, the second inactive regions 124 have a shape of rectangle or square in the plan view. In some embodiments, the second inactive regions 124 may also have chamfered corners.

In some embodiments, a third inactive region 126 is interposed between adjacent ones of the first inactive regions 122 in the first direction and between adjacent ones of the second inactive regions 124 in the second direction. In some embodiments, the third inactive region 126 is separated from the first inactive regions 122 by the first segment 106A of the second trenches 106 and separated from the second inactive regions 124 by the second segment 104B of the first trenches 104. The third inactive region 126 may have an edge 126E formed along the third trenches 108, which forms a chamfered corner of the third inactive region 126. Accordingly, the chamfered corner (e.g., the third edge 120C) of integrated circuit region 120 and the chamfered corner (e.g., the edge 126E) of the third inactive region 126 are at opposite sides of the third trenches 108. In some embodiments, the third inactive regions 126 have a shape of octagon in the plan view. Although FIG. 2B illustrates the edge 126E is a straight line, the edge 126E may be a curved line.

In some embodiments, the first segment 104A of the first trenches 104, the first segment 106A of the second trenches, 106, and the third trenches 108 may intersect and form the first intersecting area 130. The first intersecting area 130 may be at least surrounded by the first edge 120A of the integrated circuit region 120, the third edge 122C of the first inactive region 122, and the edge 126E of the third inactive region 126. In some embodiments, the first intersecting area 130 has a hexagon region or the like, as illustrated in FIG. 2B. In some embodiments, the second segment 104B of the first trenches 104, the second segment 106B of the second trenches 106, and the third trenches 108 may intersect and form the second intersecting area 132. In some embodiments, the second intersecting area 132 has a triangle region or the like, as illustrated in FIG. 2B. In some embodiments, the chamfered corners of the first inactive regions 122 provide an enlarged gap $G_2$ between the integrated circuit regions 120 and the first inactive regions 122 (as compared to the gap $G_1$ between the first edge 120A of the integrated circuit region 120 and the first edge 122A of the first inactive region 122) as well as a greater area for the first intersecting area 130 (e.g., greater than the second intersecting area 132). In some embodiments, the distance $D_1$ from the third edge 120C to a point intersected by a line including the first edge 122A of the first inactive region 122 and a line including the second edge 122B of the first inactive region 122 is in a range from 1 µm to 10 µm, such as 3 µm. In some embodiments, the distance $D_2$ from the first edge of the integrated circuit region 120 to a point intersected by a line including the first edge 120A of the integrated circuit region 120 and a line including the second edge 120B of the integrated circuit region 120. In some embodiments, the distance $D_2$ is 3 µm to 15 µm, such as 5 µm. The distance $D_2$ is greater than $D_1$ so that the length $L_2$ of the third edge 122C of the first inactive region 122 may be greater than the length $L_1$ of the third edge 120C of the integrated circuit region 120, even when the angle ß is equal to the angle α.

Figure 3:
Figure 4:
Figure 4:
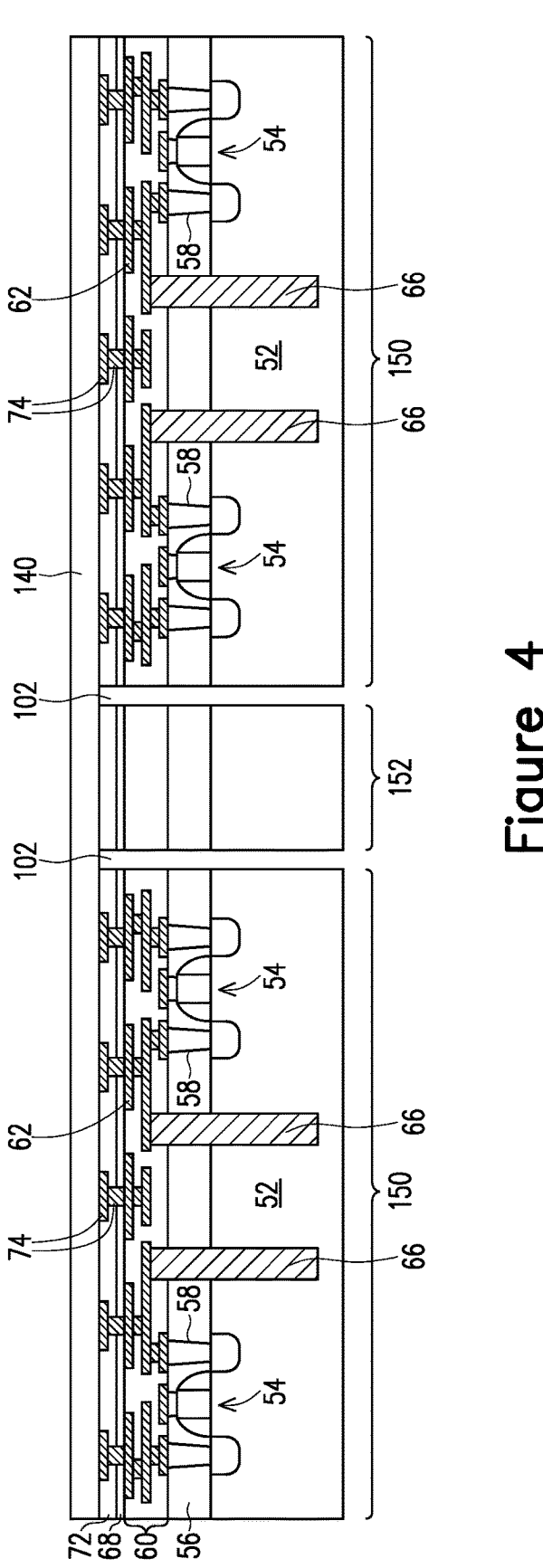

In FIG. 3, the semiconductor piece 30 is attached to a carrier 140, which may be on the dielectric layer 72 and the die connectors 74. The carrier 140 may be a tape, a semiconductor carrier, a glass carrier, a ceramic carrier, or the like. In FIG. 4, a thinning process is performed on the back side of the semiconductor substrate 52, which results in the singulation of the integrated circuit die 150 from each other. The thinning process may be performed using a chemical-mechanical polish (CMP), a grinding process, an etch-back process, the like, or a combination thereof, whereby chemical etchants and abrasives may be utilized to react and grind away portions of the semiconductor substrate 52 until the trenches 102 are exposed. As such, each of the integrated circuit regions 120 is singulated to form an integrated circuit die 150. In some embodiments, the first inactive regions 122, the second inactive regions 124, and the third inactive regions 126 may also be singulated, thereby forming first inactive features 152, second inactive features, and third inactive features, respectively.

Figure 5:
Figure 5:
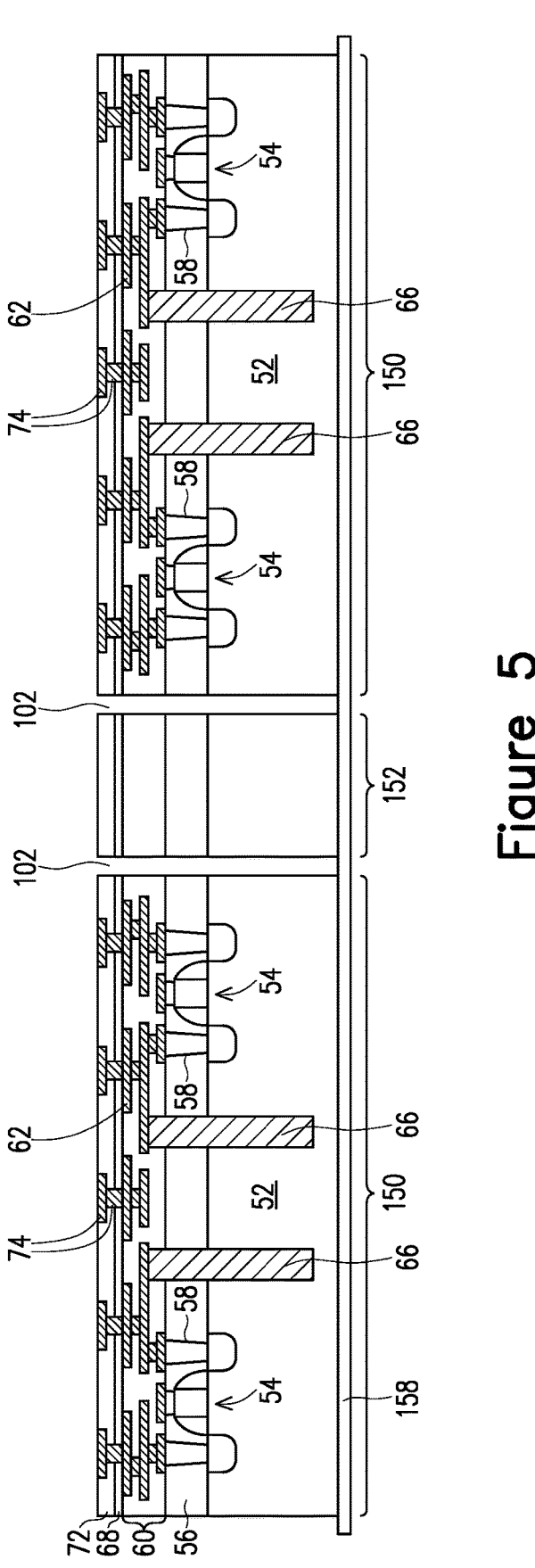

In FIG. 5, a tape 158 is attached to the back-side surfaces of the integrated circuit dies 150, the first inactive features 152, the second inactive features (not shown in FIG. 5), and the third inactive features (not shown in FIG. 5). The tape 158 may be an adhesive tape, such as a blue tape or a UV tape. Next, the integrated circuit dies 150, the first inactive features 152, the second inactive features, and the third inactive features are detached from the carrier 140.

After the detachment, the integrated circuit dies 150, the first inactive features 152, the second inactive features, and the third inactive features may be transferred to other working stations for performing packaging processes or shipping processes. For example, the integrated circuit dies 150 may be transferred to a working station for performing a pick-and-place process, where the known-good dies (KGD) of the integrated circuit dies 150 are picked up from the tape 158 for being integrated into an integrated circuit package. The integrated circuit dies 150, the first inactive features 152, the second inactive features, and the third inactive features may be placed on the tape 158 and transferred to other working stations by carrying the tape 158. In some embodiments, the tape 158 may be vibrated or deformed during the transfer and may cause the integrated circuit dies 50 be collided with other components, such as the first inactive features 152. In some embodiments, the enlarged space (e.g., the gap $G_2$) and misalignment between corners of the integrated circuit dies 150 and corners of the first inactive features 152 in the second direction can reduce or prevent collision of the corners of the integrated circuit dies 150 and the corners of the first inactive features 152. In addition, the chamfered corners of the integrated circuit dies 150 and the chamfered corners of the first inactive features 152 may reduce stress applying to or suffering from other components, thereby reducing or preventing the integrated circuit dies 150 from being damaged by the collisions. Thus, the integrated circuit dies 150 may have an improved manufacturing yield and reliability. In some embodiments, the first inactive features 152 allow greater recession (e.g., the distance $D_2$) for forming greater chamfered corners, and therefore may further enlarge the gap $G_2$ without sacrificing active areas of the integrated circuit dies 150 for forming integrated circuits.

FIGS. 6 through 14 are cross-sectional views of intermediate stages in the manufacturing of an integrated circuit package 200, in accordance with some embodiments. FIG. 15 is a plan view at an intermediate stage in the manufacturing of the integrated circuit package 200, in accordance with some embodiments. FIGS. 6 through 14 are cross-sectional views shown along respective reference cross-sections C-C in FIG. 15.

Figure 6:
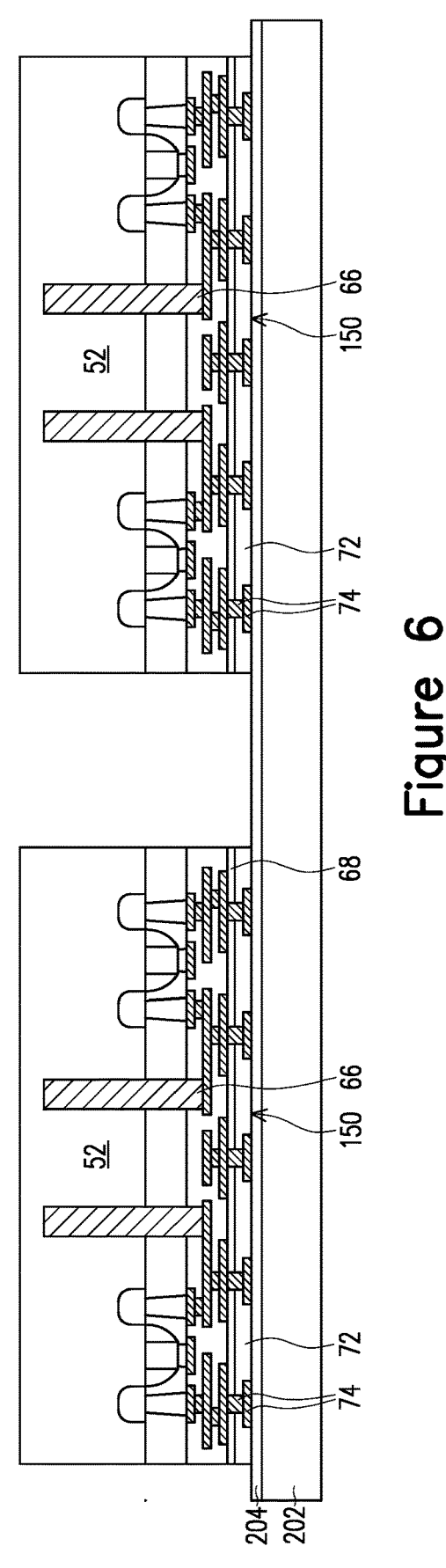
FIGS. 6 through 14 are cross-sectional views of intermediate stages in the manufacturing of an integrated circuit package, in accordance with some embodiments.

In FIG. 6, one or more integrated circuit dies 150 are attached to a carrier substrate 202, for forming a first tier 200A of the integrated circuit package 200, in accordance with some embodiments. The carrier substrate 202 may be a glass carrier substrate, a semiconductor carrier substrate, a ceramic carrier substrate, or the like. The carrier substrate 202 may be a wafer or a panel, such that multiple packages can be formed on the carrier substrate 202 simultaneously. The integrated circuit dies 150 may be attached to the carrier substrate 202 in a face-down manner, such that the front sides of the integrated circuit dies 150 are attached to the carrier substrate 202. The integrated circuit dies 150 may be placed by, e.g., a pick-and-place process. In some embodiments, the integrated circuit dies 150 are attached to the carrier substrate 202 with a release layer 204. In some embodiments, the release layer 204 is a thermal-release material, which may lose its adhesive property when heated, such as a light-to-heat-conversion (LTHC) release coating; an ultra-violet (UV) glue, which may lose its adhesive property when exposed to UV lights; or the like. The release layer 204 may be dispensed as a liquid and cured, may be a laminate film laminated onto the carrier substrate 202 before the attachment of the integrated circuit dies 150.

Figure 7:
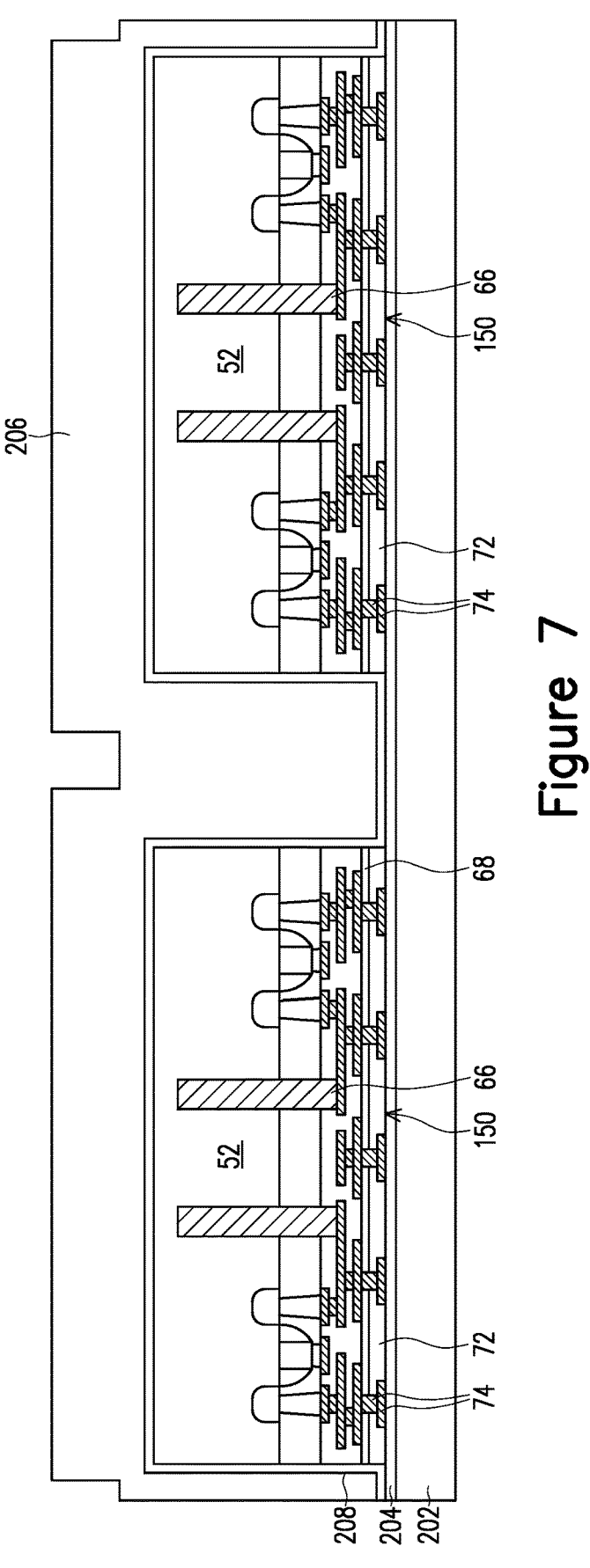

In FIG. 7, a gap-fill dielectric 206 is formed around the integrated circuit dies 150 and between the neighboring integrated circuit dies 150 over the carrier substrate 202. The gap-fill dielectric 206 may bury or cover the back side of the integrated circuit dies 150. The gap-fill dielectric 206 may be formed of a dielectric material, such as silicon oxide, phosphosilicate glass (PSG), borosilicate glass (BSG), boron-doped phosphosilicate glass (BPSG), a combination thereof, or the like, which may be formed by a suitable deposition process such as CVD, PVD, coating, laminating, or the like. In some embodiments, a protective layer 208 is formed between the gap-fill dielectric 206 and the integrated circuit dies 150, the release layer 204 (if present), and the carrier substrate 202. For example, the protective layer 208 is formed around the integrated circuit dies 150, and the gap-fill dielectric 206 is formed on the protective layer 208. Acceptable material of the protective layer 208 may include a nitride such as silicon nitride, silicon carbonitride, silicon oxynitride, silicon oxycarbonitride, or the like, which may be formed by a suitable deposition method such as CVD, PVD, ALD, combinations thereof, or the like. The protective layer 208 may help stop cracking (if have) in the gap-fill dielectric 206 being extended to the integrated circuit dies 150.

Figure 8:
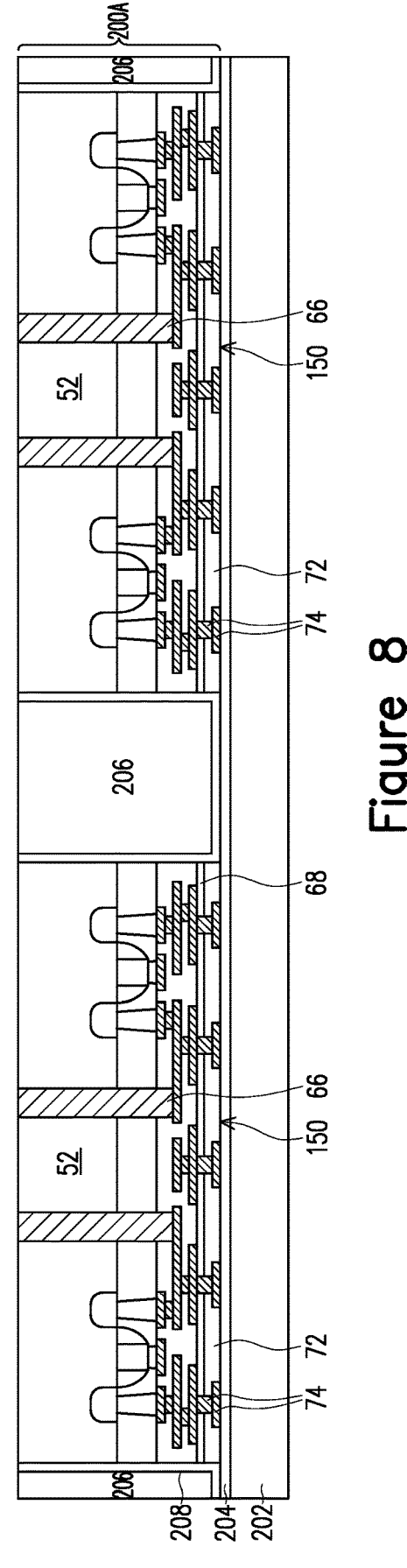

In FIG. 8, a removal process is performed to level surfaces of the gap-fill dielectric 206 and the protective layer 208 with the back-side surfaces of the integrated circuit dies 150. The removal process may also remove a portion of the semiconductor substrates 52 of the integrated circuit dies 150, thereby exposing the conductive vias 66. The removal process may be a chemical mechanical polish (CMP), grinding, an etch-back process, combinations thereof, or the like. After the removal process, surfaces of the gap-fill dielectric 206, the protective layer 208, and the integrated circuit dies 150 (including the semiconductor substrate 52 and the conductive vias 66) are coplanar (within process variations).

Figure 9:
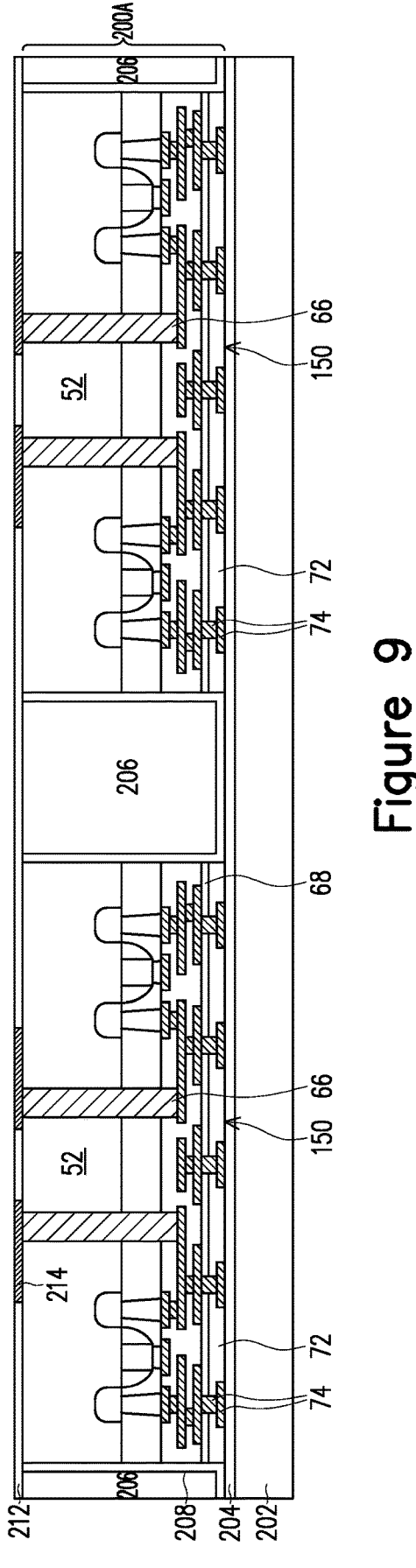

In FIG. 9, a bonding film 212 is formed over the semiconductor substrates 52 and the conductive vias 66, the gap-fill dielectric 206, and the protective layer 208, in accordance with some embodiments. The bonding film 212 may be a single layer or a composite layer including a plurality of sub-layers. The single layer or the sub-layers of the bonding film 212 may include an oxide such as silicon oxide, phosphosilicate glass (PSG), borosilicate glass (BSG), or boron-doped phosphosilicate glass (BPSG); an oxynitride such as silicon oxynitride; combinations thereof; or the like. The bonding film 212 may be formed by a suitable deposition process such as CVD, PVD, coating, other suitable deposition methods, combinations thereof, or the like.

Bonding pads 214 are formed in the bonding film 212 and over conductive vias 66 with a one to one correspondence, in accordance with some embodiments. The bonding pads 214 may include a material similar to the conductive vias 66. In some embodiments, the bonding pads 214 include a multi-layer structure, such as including a main layer and a barrier layer surrounding a bottom and sidewalls of the main layer. The main layer may include copper or other low-resistance material such as copper, a copper alloy, silver, gold, tungsten, cobalt, aluminum, nickel, a combination thereof, or the like, and the barrier layer may include titanium, titanium nitride, tantalum, tantalum nitride, combinations thereof, or the like. The formation of the bonding pads 214 may include etching the bonding film 212 for forming openings for the bonding pads 214. The openings may expose the conductive vias 66. Materials of the bonding pads 214 may then be deposited in the openings and over the bonding film 212, such as by electroplating, electroless plating, CVD, ALD, PVD, combinations thereof, or the like. Excess material of the bonding pads 214 over the bonding film 212 may be removed by a planarization process, such as CMP or grinding. In some embodiments, the bonding pads 214 have a size greater than the size of conductive vias 66 in a plan view. For example, the length and/or width of the bonding pads 214 may be greater than the height of the bonding pads 214.

Figure 10:
Figure 12:
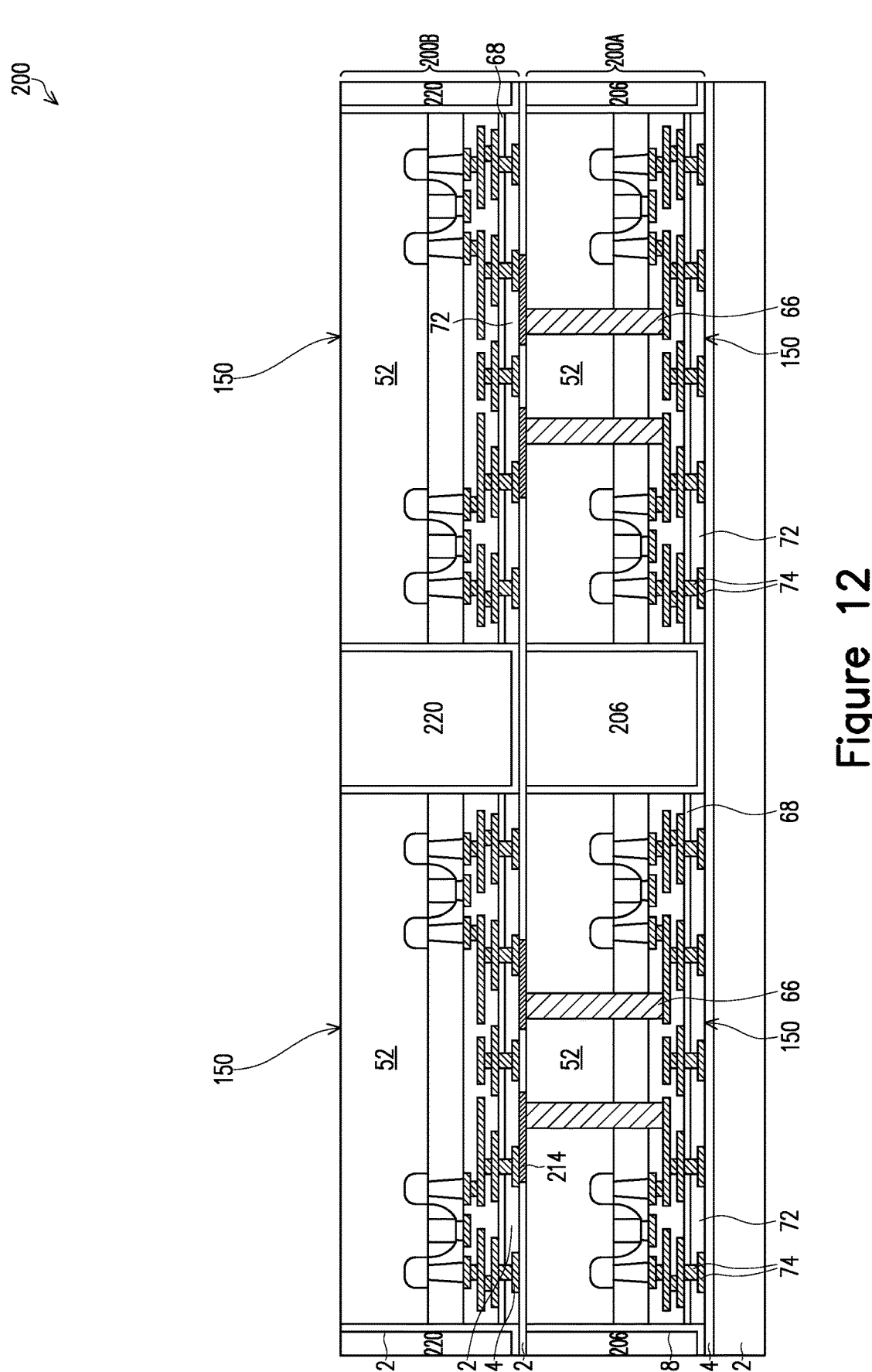

In FIG. 10, one or more of the integrated circuit dies 150 are bonded to the bonding film 212 and the bonding pads 214, for forming a second tier 200B of the integrated circuit package 200 (e.g., see FIG. 12). The integrated circuit dies 150 may be bonded to the bonding film 212 and the bonding pads 214 by hybrid bonding. For example, the dielectric layers 72 of the integrated circuit dies 150 are directly bonded to the bonding film 212 through dielectric-to-dielectric bonding, without using any adhesive material (e.g., die attach film). The die connectors 74 of the integrated circuit dies 150 are directly bonded to respective bonding pads 214 through metal-to-metal bonding, without using any eutectic material (e.g., solder). The bonding may include a pre-bonding and an annealing. During the pre-bonding, a small pressing force is applied to press the integrated circuit die 150 against the bonding film 212 and the bonding pads 214. The pre-bonding is performed at a low temperature, such as room temperature, and after the pre-bonding, the dielectric layer 72 is bonded to the bonding film 212. The bonding strength is then improved in a subsequent annealing step, in which the bonding film 212, the bonding pads 214, the dielectric layers 72, and the die connectors 74 are annealed. After the annealing, direct bonds such as fusion bonds are formed, bonding the bonding film 212 to the dielectric layer 72. The bonds may be covalent bonds between the material of the bonding film 212 and the material of the dielectric layer 72. The bonding pads 214 are connected to the die connectors 74 of the integrated circuit dies 150. The bonding pads 214 and the die connectors 74 may be in physical contact after the pre-bonding, or may expand to be brought into physical contact during the annealing. Further, during the annealing, the material of the bonding pads 214 and the die connectors 74 may be intermingled so that metal-to-metal bonds are also formed. Hence, the resulting bonds between the integrated circuit die 150 and the bonding film 212 as well as the bonding pads 214 are hybrid bonds that include both dielectric-to-dielectric bonds and metal-to-metal bonds.

In some embodiments, the integrated circuit dies 150 in the second tier 200B do not include conductive vias 66. For example, the integrated circuit packages 200 include two tiers of integrated circuit dies 150, and the conductive vias 66 are excluded from the integrated circuit dies 150 in the second tier 200B because the integrated circuit dies 150 of the second tier 200B are in the upper tier of integrated circuit dies 150 in the integrated circuit package 200. In some embodiments, the integrated circuit package 200 includes more than two tiers of integrated circuit dies 150, and the conductive vias 66 may be formed in each tier of the integrated circuit dies besides the uppermost tier of integrated circuit dies.

Figure 11:

In FIG. 11, a gap-fill dielectric 220 is formed around the integrated circuit dies 150 and between the neighboring integrated circuit dies 150, in accordance with some embodiments. The gap-fill dielectric 220 may bury or cover the integrated circuit dies 150 in the second tier 200B, such that the top surface of the gap-fill dielectric 220 is above the top surfaces of the integrated circuit dies 150 in the second tier 200B. The gap-fill dielectric 220 may be formed of a dielectric material, such as silicon oxide, PSG, BSG, BPSG, a combination thereof, or the like. In some embodiments, the gap-fill dielectric 220 is formed of a similar dielectric material as the gap-fill dielectric 206. The gap-fill dielectric 220 may be formed by a similar method as the gap-fill dielectric 206. In some embodiments, a protective layer 222 is disposed between the gap-fill dielectric 220 and the integrated circuit dies 150 and over the gap-fill dielectric 206. For example, the gap-fill dielectric 206 is disposed on the protective layer 222. The protective layer may be formed of a dielectric material, such as silicon nitride, silicon oxynitride, or the like, and may be formed before forming the gap-fill dielectric 220 by a suitable deposition process such as CVD, ALD, or the like.

In FIG. 12, a planarization process is performed to level the gap-fill dielectric 220 with the back-side surfaces of the integrated circuit dies 150. In some embodiments, the planarization process may include CMP, grinding, an etch-back process, combinations thereof, or the like. After the planarization process, surfaces of the gap-fill dielectric 220 and the protective layer 222 and the back-side surfaces of the integrated circuit dies 150 are coplanar (within process variations).

Figure 13:

In FIG. 13, a bonding layer 224 is formed over the integrated circuit dies 150 and the gap-fill dielectric 220. The bonding layer 224 may include a dielectric material, such as silicon dioxide or the like, and may be formed by a suitable deposition process such as CVD, ALD, or the like. A support substrate 226 is attached to the integrated circuit dies 150 through the bonding layer 224. The support substrate 226 may be a blank semiconductor substrate (e.g., Si substrate), a glass substrate, or a ceramic substrate, either in a wafer form or a panel form. In some embodiments, the support substrate 226 includes a bonding film disposed on the surface of the support substrate 226. The bonding layer 224 may be a single layer or a composite layer including a plurality of sub-layers. The single layer or the sub-layers of the bonding layer 224 may include an oxide such as silicon oxide, PSG, BSG, or BPSG; an oxynitride such as silicon oxynitride, combinations thereof, or the like. In some embodiments, the bonding layer 224 and the bonding film of the support substrate 226 may be bonded through dielectric-to-dielectric bonds, such as covalent bonds.

Figure 14:
Figure 15:
FIG. 15 is a plan view at an intermediate stage in the manufacturing of an integrated circuit package, in accordance with some embodiments.

In FIG. 14, a carrier substrate de-bonding is performed to detach (or "de-bond") the carrier substrate 202 from the integrated circuit dies 150. The de-bonding may include projecting a light such as a laser light or a UV light on the release layer 204 so that the release layer 204 decomposes under the heat of the light and the carrier substrate 202 can be removed.

Conductive connectors 250 are formed on the die connectors 74 of the integrated circuit dies 150 in the first tier 200A. The conductive connectors 250 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 250 may include a conductive material such as solder, copper, aluminum, gold, nickel, silver, palladium, tin, the like, or a combination thereof. In some embodiments, the conductive connectors 250 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes. The conductive connectors 250 may be subsequently utilized to connect the integrated circuit package 200 to another component, such as an interposer, a packaging substrate, or the like.

In some embodiments, the integrated circuit packages 200 are formed in a wafer level, and a singulation process may be performed to separate the integrated circuit packages 200 as individual packages. For example, the integrated circuit package 200 as illustrated in FIG. 14 may be one of the resulting individual packages. The singulation process may include a mechanical process such as a sawing process, a cutting process, or the like. A plan view of the integrated circuit package 200 is illustrated in FIG. 15, wherein the conductive connectors 250, the support substrate 226, and the bonding layer 224 are not shown for clarity purposes. In some embodiments, each of the integrated circuit dies 150 has a shape of octagon. The chamfered corners of the integrated circuit dies 150 may help reduce the stress applied on the corners of the integrated circuit dies 150, thereby reducing the risks of delamination of the gap-fill dielectrics 206 and 220 or cracking occurred in the integrated circuit dies 150 during the manufacturing and operation of the integrated circuit package 200, thereby improving the reliability of the integrated circuit package 200.

Figure 16:
FIG. 16 is a cross-sectional view of an intermediate stage in the manufacturing of an integrated circuit package, in accordance with some embodiments.
Figure 17:
FIG. 17 is a plan view at an intermediate stage in the manufacturing of an integrated circuit package, in accordance with some embodiments.

Although FIG. 14 illustrate two integrated circuit dies 150 are disposed in the second tier 200B, one or more of the integrated circuit dies 150 may be replaced with inactive features, in accordance with some embodiments. The inactive features may be the first inactive feature 152, the second inactive features, and/or the third inactive features of the semiconductor piece 30, or other suitable inactive features. For example, an integrated circuit package 300 is illustrated in FIG. 16, in which one of the integrated circuit die 150 is replaced with one or more of the first inactive features 152. The dielectric layer 72 of the first inactive feature 152 may be bonded to the bonding film 212 by dielectric-to-dielectric bonding without using any adhesive material (e.g., die attach film). The bonding may include a pre-bonding and an annealing. During the pre-bonding, a small pressing force is applied to press the first inactive feature against the bonding film 212. The pre-bonding is performed at a low temperature, such as room temperature, and after the pre-bonding, the dielectric layer 72 of the first inactive feature 152 is bonded to the bonding film 212. The bonding strength is then improved in a subsequent annealing step, in which the dielectric layer 72 of the first inactive feature 152 and the bonding film 212 are annealed. After the annealing, direct bonds are formed, bonding the dielectric layer 154 to the bonding film 212. The bonds may be covalent bonds between the material of the dielectric layer 72 of the first inactive feature 152 and the bonding film 212. A plan view of the integrated circuit package 300 is illustrated in FIG. 17, wherein the conductive connectors 250, the support substrate 226, and the bonding layer 224 are not shown for clarity purpose. FIG. 16 is a cross-sectional view shown along respective reference cross-sections D-D in FIG. 17. In some embodiments, each of the integrated circuit dies 150 has a shape of octagon, and each of the first inactive features 152 has a shape of octagon. The first inactive features 152 may be smaller than the integrated circuit dies 150 (e.g., smaller footprint), and more than one first inactive features 152 (e.g., two first inactive features 152 in FIG. 17) may be disposed adjacent to the integrated circuit dies 150 for reducing the overall warpage of the integrated circuit package 300, however, more or less of the inactive features (e.g., the first inactive features 152 and/or other inactive features) may be disposed in the integrated circuit package 300.

Figure 18:
FIGS. 18 through 22 are cross-sectional views of intermediate stages in the manufacturing of an integrated circuit package, in accordance with some embodiments.
Figure 18:
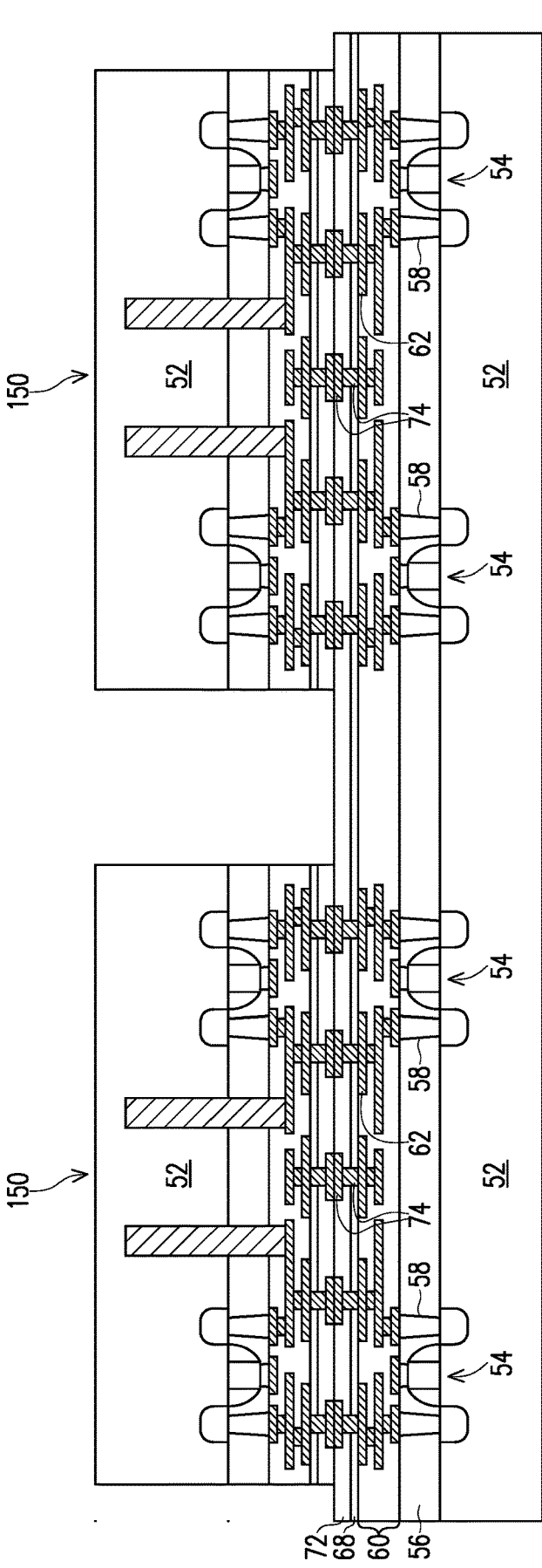

FIGS. 18 through 22 are cross-sectional views of intermediate stages in the manufacturing of an integrated circuit package 400, in accordance with some embodiments. The integrated circuit package 400 may be manufactured by similar steps as illustrated for manufacturing the integrated circuit package 200, wherein similar referencing numerals represent similar elements. In FIG. 18, one or more integrated circuit dies 150 may be bonded to a semiconductor piece 30 in a face-to-face manner, in accordance with some embodiments. The semiconductor piece 30 may be in wafer or panel form. The integrated circuit dies 150 may be bonded to the semiconductor piece 30 by hybrid bonding. For example, the dielectric layers 72 of the integrated circuit dies 150 are directly bonded to the dielectric layer 72 of the semiconductor piece 30 through dielectric-to-dielectric bonding. The die connectors 74 of the integrated circuit dies 150 are directly bonded to respective die connectors 74 of the semiconductor piece 30 through metal-to-metal bonding.

Figure 19:
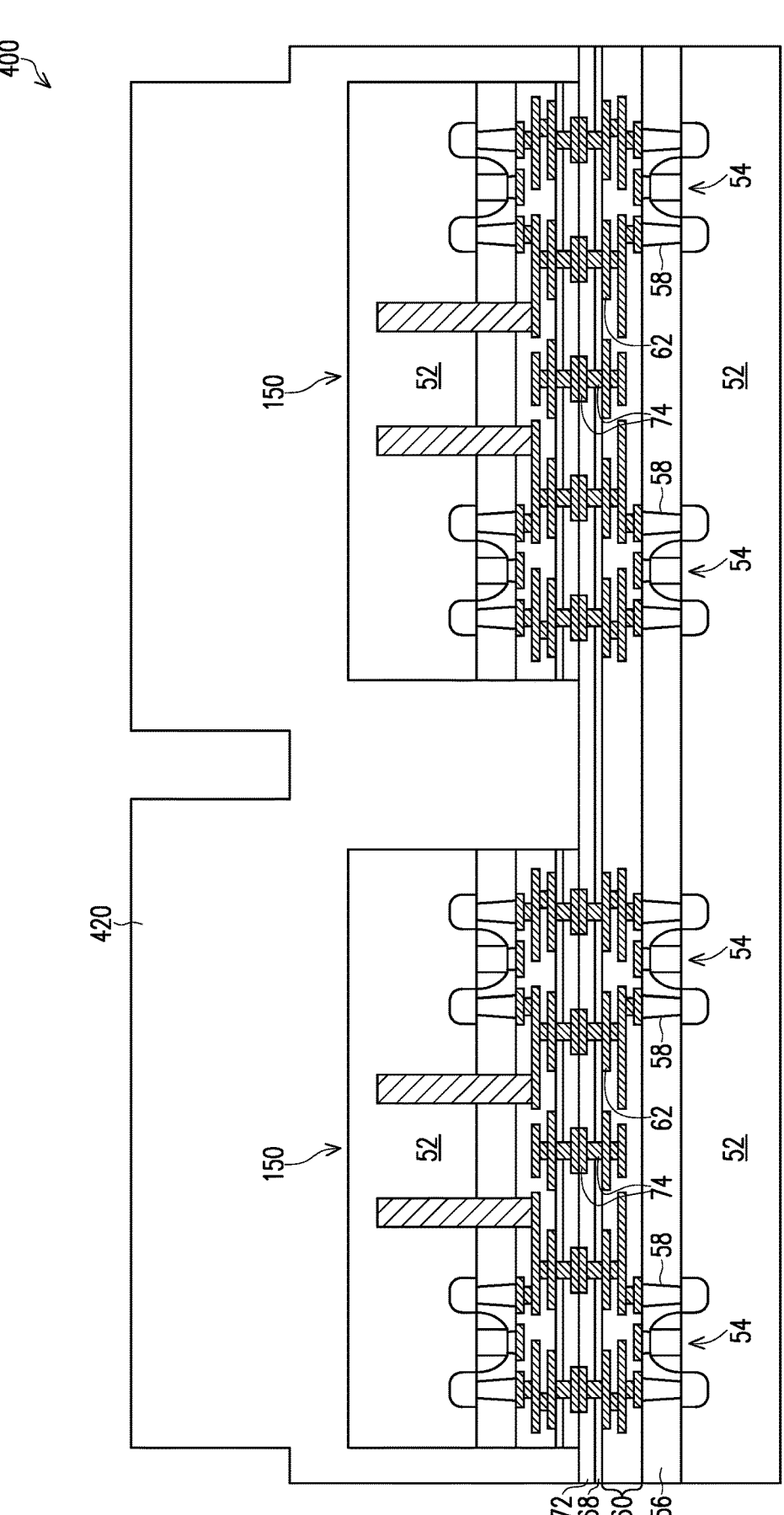
Figure 20:
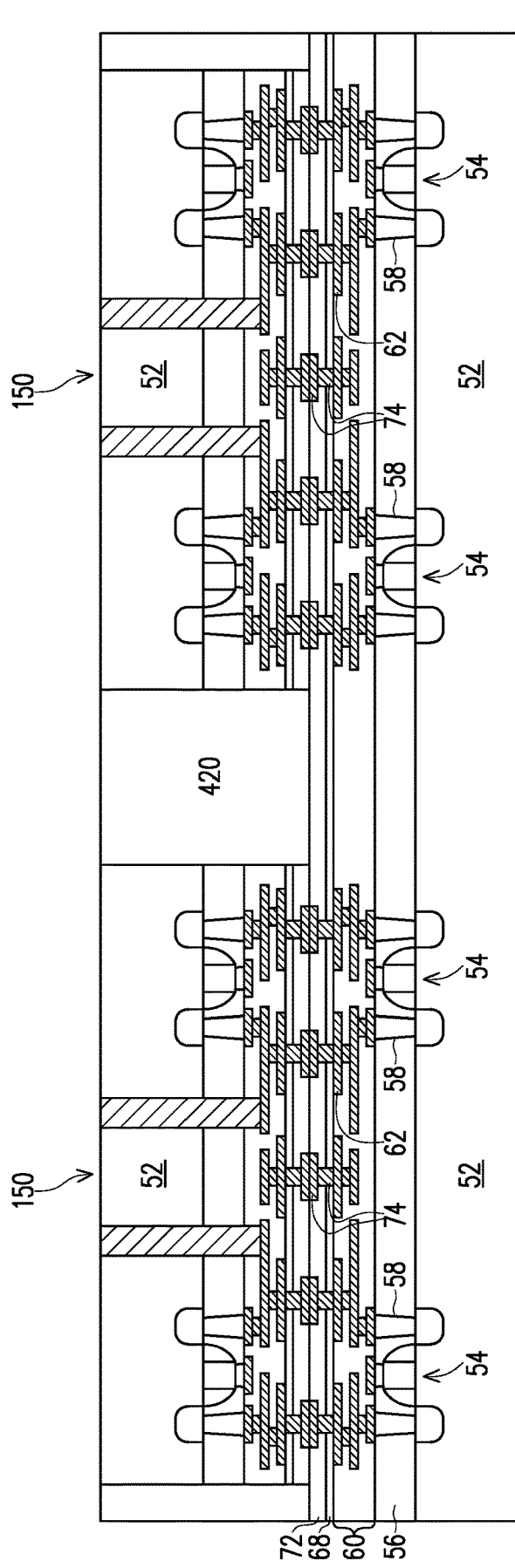

In FIG. 19, a gap-fill dielectric 420 may be formed over the integrated circuit dies 150, such as burying or covering the integrated circuit dies 150, in accordance with some embodiments. The gap-fill dielectric 420 may have a same material as the gap-fill dielectric 220 and may be formed by similar methods of forming the gap-fill dielectric 220. In some embodiments, a protective layer (not separately illustrated) may be formed between the integrated circuit dies 50 and the gap-fill dielectric 420. The protective layer may have a same material as the protective layer 208 and may be formed by similar methods. In FIG. 20, a removal process is performed for leveling the surfaces of gap-fill dielectric 420 and the integrated circuit dies 150. The removal process may also include removing a portion of the semiconductor substrate 52 to expose the conductive vias 66. The removal process may be CMP, grinding, or a combination thereof.

Figure 21:
Figure 21:
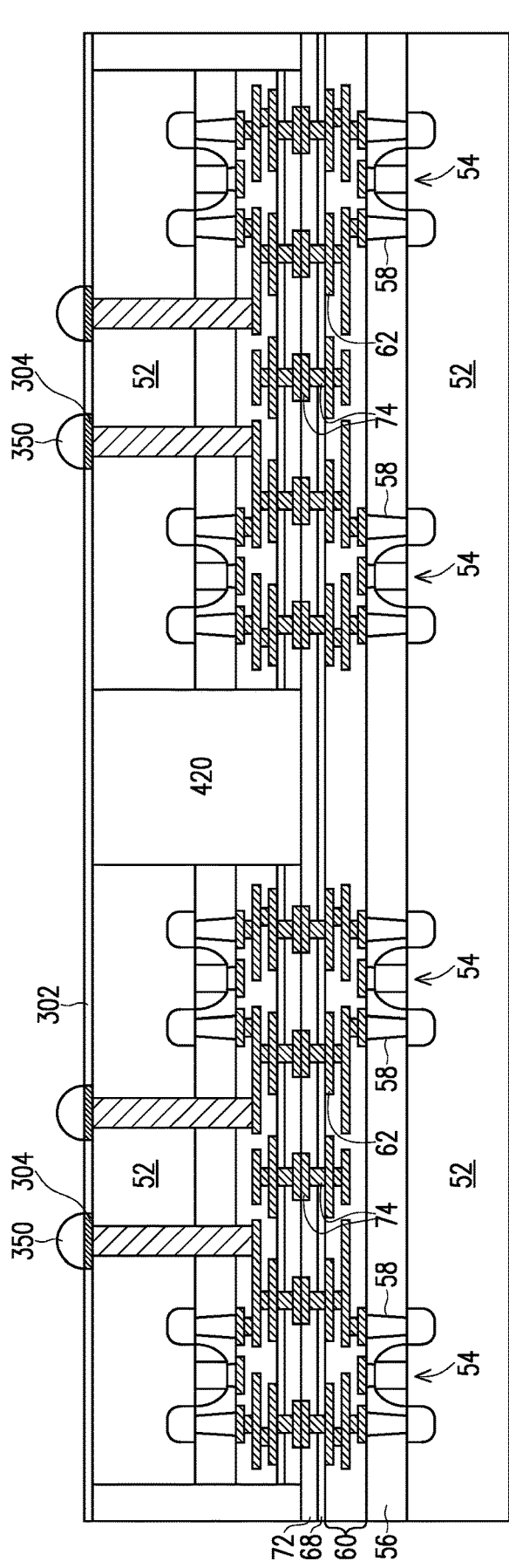
Figure 22:
Figure 22:
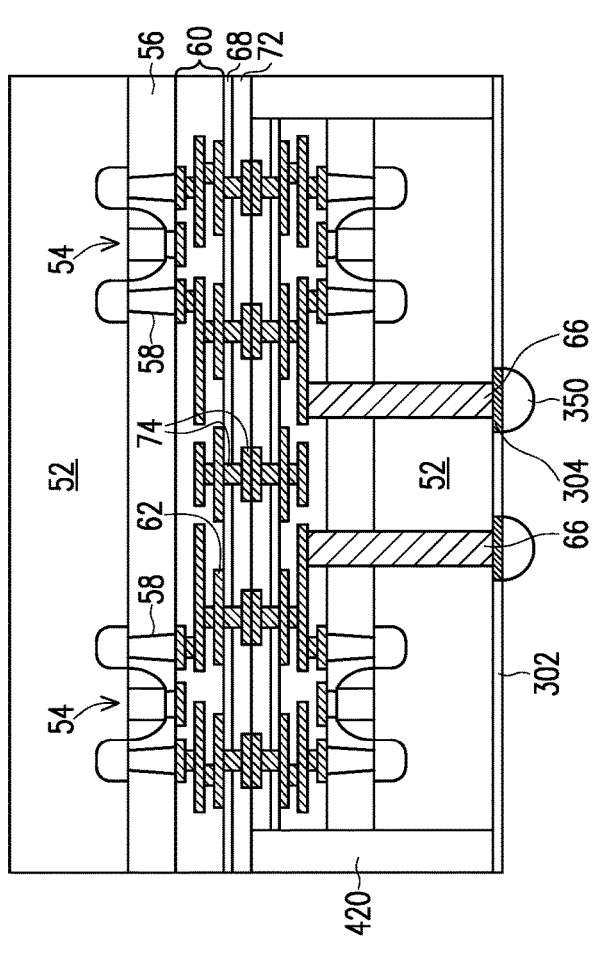

In FIG. 21, a passivation layer 302 may be formed over the integrated circuit dies 150 and the gap-fill dielectric 420, in accordance with some embodiments. The passivation layer 302 may include a dielectric material, such as silicon nitride, silicon oxynitride, aluminum nitride, a combination thereof, or the like. Conductive pads 304 may be formed in the passivation layer 302 and over respective conductive vias 66. In some embodiments, the conductive pads 304 may have a same material as the bonding pads 214 and may be formed by similar methods. In FIG. 22, conductive connectors 350 are formed on the conductive pads 304, in accordance with some embodiments. The conductive connectors 350 may have a same material the same as the conductive connectors 250 and may be formed by similar methods. In some embodiments, the integrated circuit packages 400 are formed in a wafer level, and a singulation process may be performed to separate the integrated circuit packages 400 as individual packages. For example, the integrated circuit package 400 as illustrated in FIG. 22 may be one of the resulting individual integrated circuit packages 400. The singulation process may include a mechanical process such as a sawing process, a cutting process, or the like.

Figure 23:
FIG. 23 is a plan view of a semiconductor piece at an intermediate stage of performing a singulation process on the semiconductor piece, in accordance with some embodiments.

FIG. 23 illustrates a pattern of the trenches 502 on a portion of the semiconductor piece 30, in accordance with some alternative embodiments. The trenches 502 may have a pattern similar to the pattern of the trenches 102, where the semiconductor piece 30 are separated by the trenches 502 so as to include the integrated circuit regions 120, the first inactive regions 122, the second inactive regions 124, and third inactive regions 526. The third inactive regions 526 may extend at least beyond one of first inactive region 122 in the second direction (e.g., vertical) at one side. In some embodiments, one side of the third inactive region 526 may be separated from one of the second inactive regions 124 by the second segment 104B of the first trenches 104. In such embodiment, the elongated third inactive regions 526 may reduce cracking occurred in the integrated circuit regions 120 during the singulation process because additional space is derived from this design to prevent possible collision between separated structures.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Chamfered corners for the integrated circuit dies 150 and the first inactive features 152 provide enlarged space between the corners of the integrated circuit dies 150 and the first inactive features 152, such that the collisions by the corners of the integrated circuit dies 150 and the corners of the first inactive features 152 may be reduced or prevented during the transfer to other locations after the singluation process. In some embodiments, the integrated circuit dies 150 and the first inactive features 152 are integrated into an integrated circuit package, and the chamfered corners of the integrated circuit dies 150 and the chamfered corners of the first inactive features 152 may result in reduced stress applied on the integrated circuit dies 150 and may improve the reliability of the integrated circuit package.

In an embodiment, a method includes forming a semiconductor piece having a first side and a second side opposite to the first side; forming a first trench, a second trench, and a third trench from the first side of the semiconductor piece to separate the semiconductor piece such that the semiconductor piece includes an integrated circuit region, a first inactive region adjacent to a first side of the integrated circuit region, and a second inactive region adjacent to a second side of the integrated circuit region, the first trench extending in a first direction and including a first segment and a second segment, the second trench extending in a second direction and including a first segment and a second segment, the third trench extending in a third direction, wherein the third trench includes a first end intersecting the first segment of the first trench and the first segment of the second trench in a first intersecting area, wherein the third trench provides the integrated circuit region a first chamfered corner, and the first intersecting area provides the first inactive region a second chamfered corner; and thinning the semiconductor piece from the second side of the semiconductor piece to expose the first trench, the second trench, and the third trench. In an embodiment, forming the first trench, the second trench, and the third trench includes etching the semiconductor piece by a dry etch. In an embodiment, the first chamfered corner is a straight or curved line, wherein the first side and the second side of the integrated circuit region are connected to opposite ends of the first chamfered corner. In an embodiment, the second inactive region has a right-angle corner adjacent to the first chamfered corner of the integrated circuit region. In an embodiment, the third trench includes a second end connected to the second segment of the first trench. In an embodiment, the third trench includes a second end connected to the second segment of the second trench. In an embodiment, the first inactive region includes a first side adjacent to the first side of the integrated circuit region and a second side perpendicular to the first side of the first inactive region, wherein a first distance from the second chamfered corner of the first inactive region to a first point intersected by a first line including the first side of the first inactive region and a second line including the second side of the second inactive region is from 3 μm to 15 μm. In an embodiment, a second distance from the first chamfered corner to a second point intersected by a third line including the first side of the integrated circuit region and a fourth line including the second side of the integrated circuit region is smaller than or equal to the first distance.

In an embodiment, a method includes dicing a semiconductor piece from a first side of the semiconductor piece to form a first trench, a second trench, and a third trench, wherein the first trench is in a first direction, and the second trench is in a second direction perpendicular to the first direction, wherein the semiconductor piece is at least partially separated by the first trench, the second trench, and the third trench to include an integrated circuit region, a first inactive region, and a second inactive region, wherein the first trench includes a first segment and a second segment separated from each other, and the integrated circuit region and the first inactive region are separated by first segment of the first trench, wherein the second trench includes a first segment and a second segment separated from each other, and the integrated circuit region and the second inactive region are separated by the second segment of the second trench, wherein the third trench intersects the first segment of the first trench and the first segment of the second trench to form a first intersecting area, wherein the third trench intersects the second segment of the first trench and the second segment of the second trench to form a second intersecting area, wherein the first intersecting area is greater than the first intersecting area; and thinning the semiconductor piece from a second side of the semiconductor piece opposite to the first side of the semiconductor piece. In an embodiment, the integrated circuit region includes an edge along the third trench. In an embodiment, the first inactive region includes a first edge along the first segment of the first trench, a second edge along the first segment of the second trench, and a third edge along an edge of the first intersecting area. In an embodiment, the semiconductor piece is separated by the first trench, the second trench, and the third trench to include a third inactive region, wherein the third inactive region is separated from the integrated circuit region by the third trench. In an embodiment, the third inactive region is separated from the second inactive region by the second segment of the first trench. In an embodiment, the integrated circuit region has a shape of octagon in a plan view. In an embodiment, the method further includes attaching a tape to the first side of the semiconductor piece before thinning the semiconductor piece.

In an embodiment, a device includes an integrated circuit die including a first sidewall, a second sidewall, and a third sidewall, wherein the third sidewall of the integrated circuit die is connected to the first sidewall of the integrated circuit die and the second sidewall of the integrated circuit die, wherein the third sidewall of the integrated circuit die forms a chamfered corner of the integrated circuit die; a first dielectric surrounding the integrated circuit die; and a semiconductor feature disposed over the integrated circuit die, wherein the semiconductor feature includes a first sidewall, a second sidewall, and a third sidewall, wherein the third sidewall of the semiconductor feature is connected to the first sidewall of the semiconductor feature and the second sidewall of the semiconductor feature and forms a chamfered corner of the semiconductor feature; and a second dielectric surrounding the semiconductor feature. In an embodiment, the semiconductor feature is an inactive feature, wherein the semiconductor feature includes a dielectric layer over a semiconductor substrate. In an embodiment, the semiconductor feature is bonded to the integrated circuit die at least through a dielectric-to-dielectric bonding. In an embodiment, a first distance from the third sidewall of the integrated circuit die to a first point intersected by a first line including the first sidewall of the integrated circuit die and a second line including the second sidewall of the integrated circuit die is smaller than a second distance from the third sidewall of the semiconductor feature to a second point intersected by a third line including the first sidewall of the semiconductor feature and a fourth line including the second sidewall of the semiconductor feature. In an embodiment, a first angle included by the first sidewall of the integrated circuit die and the third sidewall of the integrated circuit die is equal to a second angle included by the first sidewall of the semiconductor feature and the third sidewall of the semiconductor feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a semiconductor piece having a first side and a second side opposite to the first side;
forming a first trench, a second trench, and a third trench from the first side of the semiconductor piece to partially separate the semiconductor piece such that the semiconductor piece comprises an integrated circuit region, a first inactive region adjacent to a first side of the integrated circuit region, and a second inactive region adjacent to a second side of the integrated circuit region, the first trench extending in a first direction and comprising a first segment and a second segment, the second trench extending in a second direction and comprising a first segment and a second segment, the third trench extending in a third direction, wherein the third trench comprises a first end intersecting the first segment of the first trench and the first segment of the second trench in a first intersecting area, wherein the third trench provides the integrated circuit region a first chamfered corner, and the first intersecting area provides the first inactive region a second chamfered corner;
thinning the semiconductor piece from the second side of the semiconductor piece to fully separate the integrated circuit region, the first inactive region, and the second inactive region; and
depositing a first dielectric material over the integrated circuit region.

2. The method of claim 1, further comprising:
forming contact pads in the first dielectric material, the contact pads having respective exposed contact surfaces;
placing a semiconductor feature over the integrated circuit region, wherein the semiconductor feature comprises a first sidewall, a second sidewall, and a third sidewall connected to the first sidewall of the semiconductor feature and the second sidewall of the semiconductor feature and forms a chamfered corner of the semiconductor feature, wherein the semiconductor feature further comprises bond pads;
electrically connecting the bond pads of the semiconductor feature to the contact pads; and
depositing a second dielectric material surrounding the semiconductor feature.

3. The method of claim 1, wherein the first chamfered corner is a straight or curved line, wherein the first side and the second side of the integrated circuit region are connected to opposite ends of the first chamfered corner.

4. The method of claim 1, wherein the second inactive region has a right-angle corner adjacent to the first chamfered corner of the integrated circuit region.

5. The method of claim 1, wherein the third trench comprises a second end connected to the second segment of the first trench.

6. The method of claim 1, wherein the third trench comprises a second end connected to the second segment of the second trench.

7. The method of claim 1, wherein the first inactive region comprises a first side adjacent to the first side of the integrated circuit region and a second side perpendicular to the first side of the first inactive region, wherein a first distance from the second chamfered corner of the first inactive region to a first point intersected by a first line including the first side of the first inactive region and a second line including the second side of the second inactive region is from 3 µm to 15 µm.

8. The method of claim 7, wherein a second distance from the first chamfered corner to a second point intersected by a third line including the first side of the integrated circuit region and a fourth line including the second side of the integrated circuit region is smaller than or equal to the first distance.

9. A method comprising:

provisioning a semiconductor piece having a first side and a second side opposite to the first side;

partially dicing the semiconductor piece from the first side of the semiconductor piece to form a first trench, a second trench, and a third trench, wherein the first trench is in a first direction, and the second trench is in a second direction perpendicular to the first direction, wherein the semiconductor piece is at least partially separated by the first trench, the second trench, and the third trench to comprise an integrated circuit region, a first inactive region, and a second inactive region, wherein the first trench comprises a first segment and a second segment offset from each other in the second direction, and the integrated circuit region and the first inactive region are separated by the first segment of the first trench, wherein the second trench comprises a first segment and a second segment offset from each other in the first direction, and the integrated circuit region and the second inactive region are separated by the second segment of the second trench, wherein the third trench intersects the first segment of the first trench and the first segment of the second trench to form a first intersecting area, wherein the third trench intersects the second segment of the first trench and the second segment of the second trench to form a second intersecting area, wherein the first intersecting area is greater than the first intersecting area; and thinning the semiconductor piece from a second side of the semiconductor piece opposite to fully separate the integrated circuit region from the first inactive region and the second inactive region; and depositing a first dielectric material over the integrated circuit region after the step of thinning the semiconductor piece.

10. The method of claim 9, further comprising:

forming contact pads in the first dielectric material, the contact pads having respective exposed contact surfaces;

placing a semiconductor feature over the integrated circuit region, wherein the semiconductor feature comprises a first sidewall, a second sidewall, and a third sidewall connected to the first sidewall of the semiconductor feature and the second sidewall of the semiconductor feature and forms a chamfered corner of the semiconductor feature, wherein the semiconductor feature further comprises bond pads;

electrically connecting the bond pads of the semiconductor feature to the contact pads; and depositing a second dielectric material surrounding the semiconductor feature.

11. The method of claim 9, wherein the first inactive region comprises a first edge along the first segment of the first trench, a second edge along the first segment of the second trench, and a third edge along an edge of the first intersecting area.

12. The method of claim 9, the semiconductor piece is separated by the first trench, the second trench, and the third trench to comprise a third inactive region, wherein the third inactive region is separated from the integrated circuit region by the third trench.

13. The method of claim 12, wherein the third inactive region is separated from the second inactive region by the second segment of the first trench.

14. The method of claim 9, wherein the integrated circuit region has a shape of an octagon in a plan view.

15. The method of claim 9, further comprising attaching a tape to the first side of the semiconductor piece before thinning the semiconductor piece.

16. A method comprising:

provisioning a wafer;

singulating an integrated circuit die from the wafer by forming a plurality of intersecting trenches extending from a first side of the wafer and extending partially through a wafer and then thinning the wafer from a second side of the wafer opposite the first side of the wafer, wherein after the singulating the integrated circuit die comprises a first sidewall, a second sidewall, and a third sidewall connected to the first sidewall of the integrated circuit die and the second sidewall of the integrated circuit die, wherein the third sidewall of the integrated circuit die forms a chamfered corner of the integrated circuit die;

depositing a first dielectric surrounding the integrated circuit die, and forming contact pads in the first dielectric, the contact pads having respective exposed contact surfaces;

placing a semiconductor feature over the integrated circuit die, wherein the semiconductor feature comprises a first sidewall, a second sidewall, and a third sidewall connected to the first sidewall of the semiconductor feature and the second sidewall of the semiconductor feature and forms a chamfered corner of the semiconductor feature, wherein the semiconductor feature further comprises bond pads;

electrically connecting the bond pads of the semiconductor feature to the contact pads; and depositing a second dielectric surrounding the semiconductor feature.

17. The method of claim 16, wherein the step of forming a plurality intersecting trenches includes forming a first trench extending in a first direction and comprising a first segment and a second segment, a second trench extending in a second direction orthogonal to the first direction and comprising a first segment and a second segment, and a third trench extending in a third direction that is non-orthogonal to the first direction, wherein the third trench comprises a first end intersecting the first segment of the first trench and the first segment of the second trench in a first intersecting area.

18. The method of claim 16, wherein the semiconductor feature is bonded to the integrated circuit die at least through a dielectric-to-dielectric bonding.

19. The method of claim 16, wherein a first distance from the third sidewall of the integrated circuit die to a first point intersected by a first line comprising the first sidewall of the integrated circuit die and a second line comprising the second sidewall of the integrated circuit die is smaller than a second distance from the third sidewall of the semiconductor feature to a second point intersected by a third line comprising the first sidewall of the semiconductor feature and a fourth line comprising the second sidewall of the semiconductor feature.

20. The method of claim 16, wherein a first angle included by the first sidewall of the integrated circuit die and the third sidewall of the integrated circuit die is equal to a second angle included by the first sidewall of the semiconductor feature and the third sidewall of the semiconductor feature.

* * * * *